(12) United States Patent
Feng et al.

(10) Patent No.: US 11,737,257 B2
(45) Date of Patent: Aug. 22, 2023

(54) SEMICONDUCTOR DEVICE AND MANUFACTURING METHOD THEREOF

(71) Applicants: UNITED MICROELECTRONICS CORP., Hsin-Chu (TW); Fujian Jinhua Integrated Circuit Co., Ltd., Quanzhou (CN)

(72) Inventors: Li-Wei Feng, Kaohsiung (TW); Yu-Hsiang Hung, Tainan (TW); Ming-Te Wei, Changhua County (TW)

(73) Assignees: UNITED MICROELECTRONICS CORP., Hsin-Chu (TW); Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 17/194,324

(22) Filed: Mar. 8, 2021

(65) Prior Publication Data
US 2021/0193668 A1      Jun. 24, 2021

Related U.S. Application Data

(62) Division of application No. 16/177,413, filed on Oct. 31, 2018, now Pat. No. 10,978,457.

(30) Foreign Application Priority Data

Oct. 9, 2018   (CN) .......................... 201811172252.7

(51) Int. Cl.
H01L 27/108       (2006.01)
H10B 12/00        (2023.01)
H01L 23/532       (2006.01)

(52) U.S. Cl.
CPC ....... *H10B 12/0335* (2023.02); *H10B 12/315* (2023.02); *H10B 12/482* (2023.02); *H01L 23/53257* (2013.01); *H01L 23/53271* (2013.01); *H10B 12/34* (2023.02)

(58) Field of Classification Search
None
See application file for complete search history.

(56) References Cited

U.S. PATENT DOCUMENTS 9,496,223 B2    11/2016   Lee
9,972,527 B2    5/2018    Kim
2012/0025333 A1  2/2012   Yoshida
(Continued)

FOREIGN PATENT DOCUMENTS

CN           1525570 A         9/2004

*Primary Examiner* — Long Pham
(74) *Attorney, Agent, or Firm* — Winston Hsu

(57) ABSTRACT

The present invention provides a semiconductor device, the semiconductor device includes a substrate, at least one bit line is disposed on the substrate, a rounding hard mask is disposed on the bit line, and the rounding hard mask defines a top portion and a bottom portion, and at least one storage node contact plug, located adjacent to the bit line, the storage node contact structure plug includes at least one conductive layer, from a cross-sectional view, the storage node contact plug defines a width X1 and a width X2. The width X1 is aligned with the top portion of the rounding hard mask in a horizontal direction, and the width X2 is aligned with the bottom portion of the rounding hard mask in the horizontal direction, X1 is greater than or equal to X2.

9 Claims, 12 Drawing Sheets

(56) References Cited

U.S. PATENT DOCUMENTS

| | | | |
|---|---|---|---|
| 2014/0231892 A1* | 8/2014 | Song | ................ H01L 21/76831 |
| | | | 257/296 |
| 2017/0210612 A1 | 7/2017 | Chen | |
| 2018/0099865 A1 | 4/2018 | Hsieh | |
| 2018/0286870 A1 | 10/2018 | Kim | |
| 2019/0345027 A1 | 11/2019 | Meinhold | |
| 2020/0115221 A1 | 4/2020 | Chien | |

* cited by examiner

SEMICONDUCTOR DEVICE AND MANUFACTURING METHOD THEREOF

CROSS REFERENCE TO RELATED APPLICATIONS

This application is a divisional application of U.S. patent application Ser. No. 16/177,413 filed Oct. 31, 2018, which is herein incorporated by reference in its entirety.

BACKGROUND OF THE INVENTION

1. Field of the Invention

The present invention relates to the field of semiconductor processing, and more particularly to a semiconductor device including a storage node contact plug and a method of fabricating the same.

2. Description of the Prior Art

Semiconductor devices are widely used in an electronic industry because of their small size, multi-function and/or low manufacture costs. Semiconductor devices are categorized as semiconductor devices storing logic data, semiconductor logic devices processing operations of logical data, hybrid semiconductor devices having both the function of the semiconductor memory devices and the function of the semiconductor logic devices and/or other semiconductor devices.

Semiconductor devices may generally include vertically stacked patterns and contact plugs electrically connecting the stacked patterns to each other. As semiconductor devices have been highly integrated, a space between the patterns and/or a space between the pattern and the contact plug have been reduced. Thus, a parasitic capacitance between the patterns and/or between the pattern and the contact plug may be increased. The parasitic capacitance may cause performance deterioration (e.g., reduction of an operating speed) of semiconductor devices.

SUMMARY OF THE INVENTION

The present invention provides a semiconductor device, the semiconductor device includes a substrate, at least one bit line disposed on the substrate, a rounding hard mask is disposed on the bit line, and the rounding hard mask defines a top portion and a bottom portion, and at least one storage node contact plug, located adjacent to the bit line, the storage node contact structure plug comprises at least one conductive layer, when viewed from a cross-sectional view, the storage node contact plug defines a width X1 and a width X2, the width X1 is aligned with the top portion of the rounding hard mask in a horizontal direction, and the width X2 is aligned with the bottom portion of the rounding hard mask in the horizontal direction, and the width X1 is greater than or equal to the width X2.

The present invention further provides method for forming a semiconductor device, firstly, a substrate is provided, next, at least one bit line is formed on the substrate, the bit line comprises a rounding hard mask disposed on at a top portion of the bit line, and the rounding hard mask defines a top portion and a bottom portion, and afterwards, at least one storage node contact plug is formed adjacent to the bit line, the storage node contact structure plug comprises at least one conductive layer, when viewed from a cross-sectional view, the storage node contact plug defines a width X1 and a width X2, the width X1 is aligned with the top portion of the rounding hard mask in a horizontal direction, and the width X2 is aligned with the bottom portion of the rounding hard mask in the horizontal direction, and the width X1 is greater than or equal to the width X2.

In the present invention, since the mask layer is etched to form a rounding hard mask, more space is left between the bit lines, especially increasing the horizontal width near the top surface of the mask layer, therefore, the difficulty of manufacturing the storage node contact plug can be reduced.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
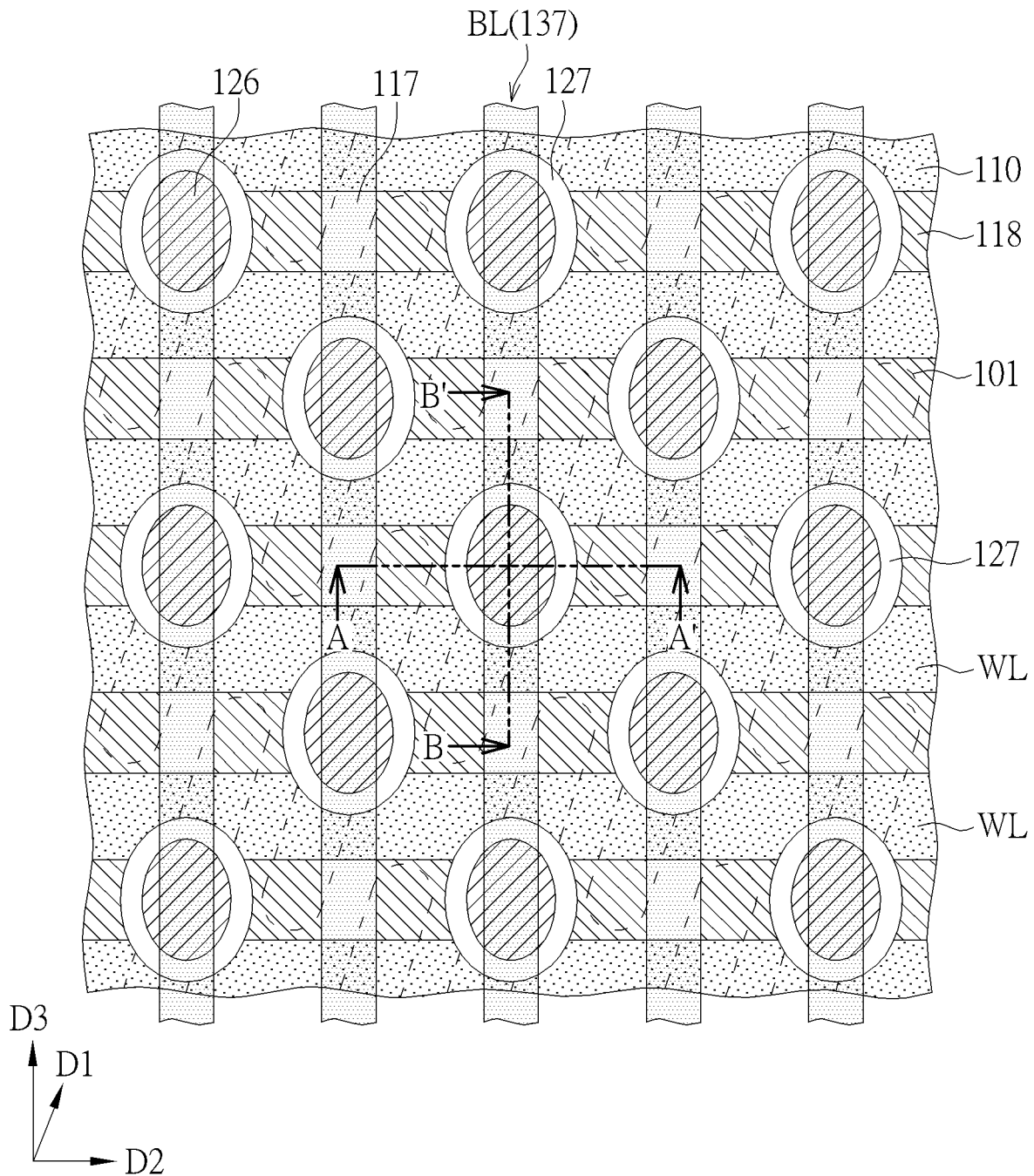
FIG. 1 is a top view of a semiconductor device according to a first embodiment of the present invention.
Figure 2:
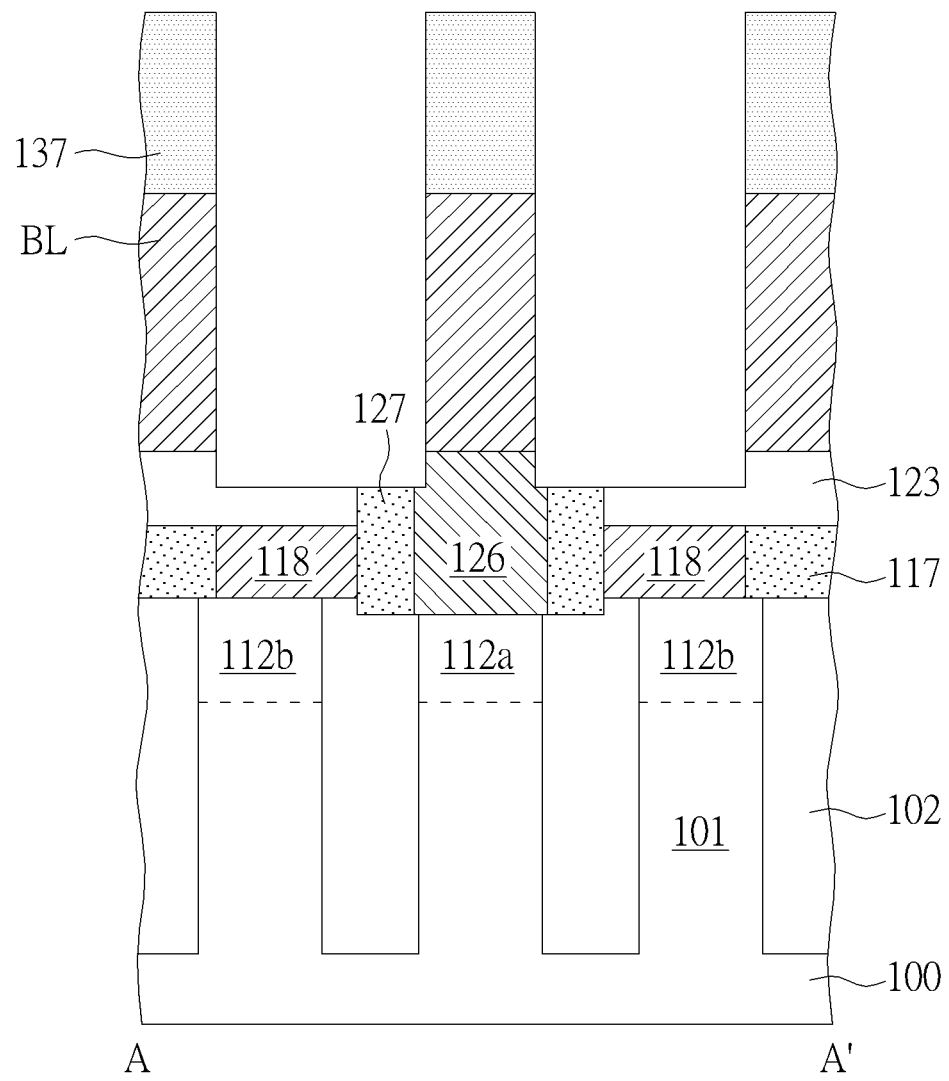
FIG. 2 is a cross-sectional view of the semiconductor device taken along section line A-A' of FIG. 1.
Figure 3:
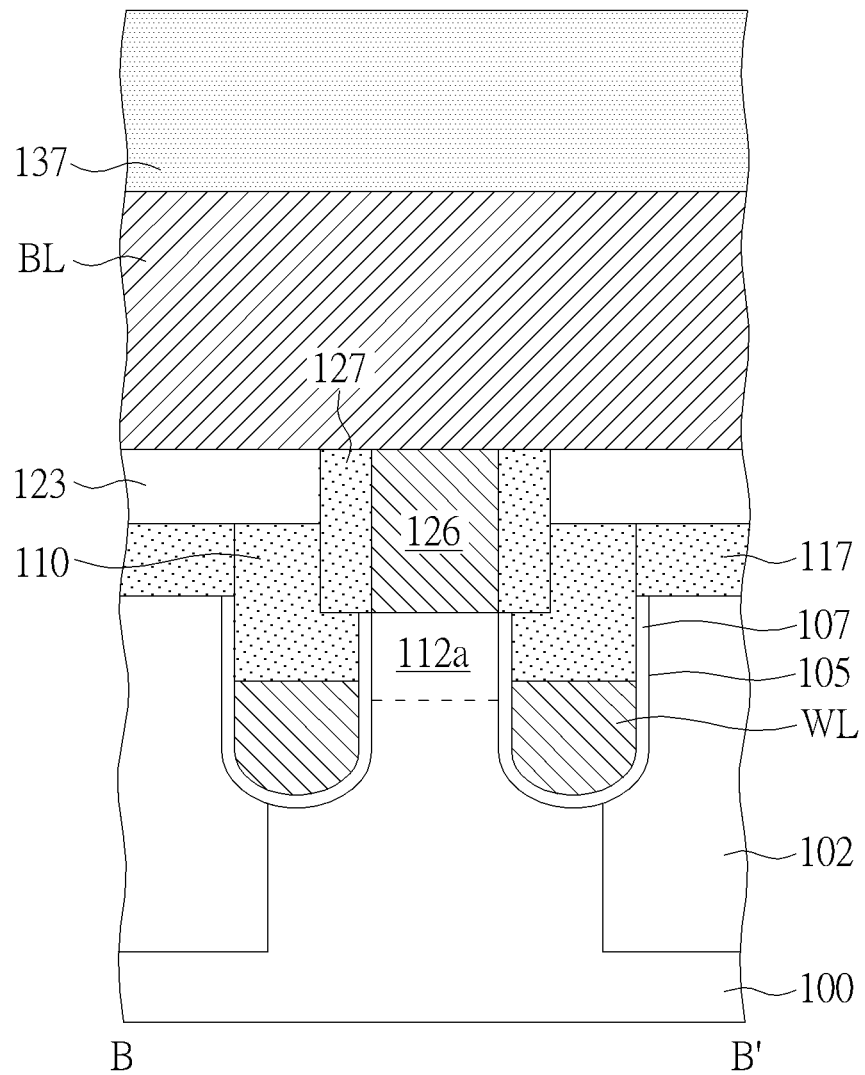
FIG. 3 is a cross-sectional view of the semiconductor device taken along section line B-B' of FIG. 1.

Please refer to FIG. 1 to FIG. 3, FIG. 1 is a top view of a first embodiment of a semiconductor device of the present invention, and FIG. 2 is a cross-sectional view of the semiconductor device taken along the section line A-A' in FIG. 1, and FIG. 3 is a cross-sectional view of the semiconductor device taken along the section line B-B' in FIG. 1. As shown in FIG. 1 to FIG. 3, a substrate 100 is provided. A plurality of active regions 101 are defined on the substrate 100. When viewed from the top view, each active area 101 is a long strip structure arranged along a first direction D1. And an insulating layer 102 is formed on the substrate 100, and which is formed around each active area 101 for electrically isolating the active regions 101. The material of the substrate 100 and the active area 101 includes, for example, a silicon substrate, a germanium substrate, or a silicon-germanium substrate, and the material of the insulating layer 102 is, for example, silicon oxide, but is not limited thereto.

A plurality of word lines WL are formed in the substrate 100, and are arranged in parallel with each other along a second direction D2. The word line WL is located within a portion of the active area 101 and a portion of the insulating layer 102, and is located within a recess 105. Any of the above active areas 101 will include two word lines WL passing through. The word line WL here can be used as a gate of a semiconductor device. Further, a gate dielectric layer 107 is formed in the recess 105. The word line WL is composed of a conductive material such as doped silicon, metal (e.g., tungsten, aluminum, titanium, and/or tantalum), conductive metal nitride (e.g., titanium nitride, tantalum nitride, and/or tungsten nitride), metal silicide and the like, but the present invention is not limited thereto. The material of the gate dielectric layer 107 may include thermal oxide, silicon nitride, silicon oxynitride, and/or high-k dielectric material. Besides, an insulating layer 110 is covered on the word line WL.

A portion of the active area 101 is doped with ions at the top of the active area 101, to form a doped region. The doped region may be used as a common drain (e.g., doped region 112a in FIG. 2) or as a source (e.g., doped region 112b in FIG. 2). When viewed from a top view, the doped region 112a is preferably formed in the middle portion of each active area 101, and the doped region 112b is preferably formed on both end portions of the active area 101. Therefore, in the present embodiment, two word lines WL are included between the two doped regions 112b in one same active area 101 from the top view. The adjacent word lines WL and the doped regions 112a and 112b constitute a transistor structure (including a gate, a source and a drain).

Besides, at least one storage node pad 118 is formed over the doped region 112b and electrically connected to the doped region 112b. The storage node pad 118 is formed in an insulating layer 117, and another insulating layer 123 is formed on the insulating layer 117, covering the storage node pad 118 and the insulating layer 117. In addition, a bit line contact structure 126 is further formed on the doped region 112a and electrically connected to the doped region 112a. A spacer 127 is formed around the bit line contact structure 126. The storage node pad 118 and the bit line contact structure 126 are made of a conductive material, such as doped silicon, metal (e.g., tungsten, aluminum, titanium, and/or tantalum), conductive metal nitride (e.g., titanium nitride, tantalum nitride, and/or tungsten nitride), metal silicide and the like, but the present invention is not limited thereto. The material of the gate dielectric layer 107 may include thermal oxide, silicon nitride, silicon oxynitride, and/or high-k dielectric material. The material of the insulating layer 117, the insulating layer 123, and the spacer spacers 127 may include insulating materials such as silicon oxide, silicon nitride, silicon oxynitride, or the like, but are not limited thereto.

As shown in FIG. 1 and FIG. 2, above the insulating layer 123, a plurality of word lines BL are further formed, the word lines BL are arranged in parallel with each other along the third direction D3, and pass through at least one bit line contact structure 126, and electrically connected to the bit line contact structure 126. In other words, the word line BL will be electrically connected to the doped region 112a. In the embodiment, the second direction D2 and the third direction D3 are preferably perpendicular to each other. In this embodiment, the bit line BL comprises a conductive material, such as doped silicon, metal (e.g., tungsten, aluminum, titanium, and/or tantalum), conductive metal nitride (e.g., titanium nitride, tantalum nitride, and/or tungsten nitride), metal silicide and the like, but the present invention is not limited thereto. In addition, a mask layer 137 is formed on each of the bit lines BL to cover each bit line BL.

Figure 4:
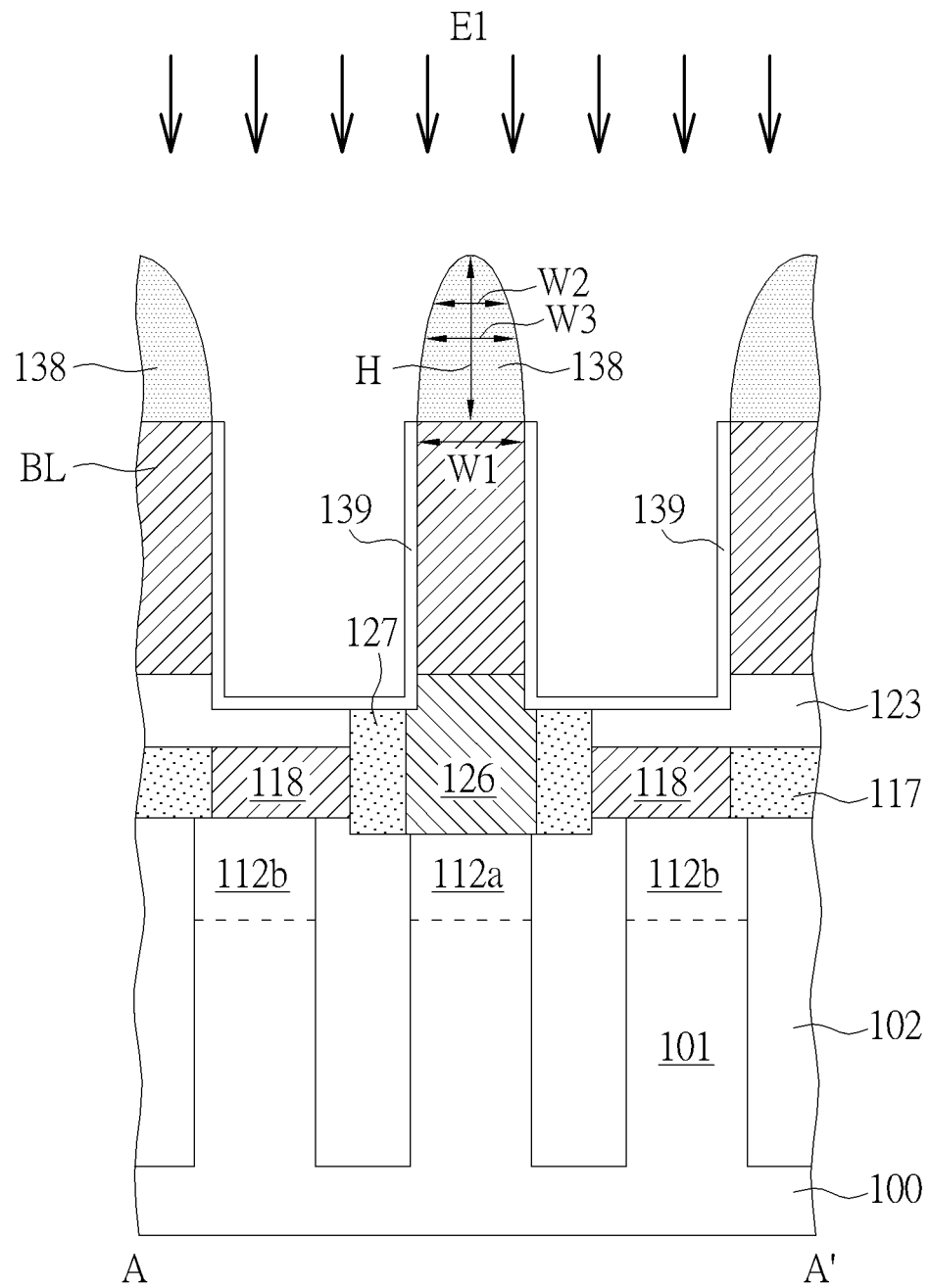
FIG. 4 to FIG. 10 are cross-sectional views showing the semiconductor device obtained by performing the subsequent steps based on the cross-sectional view shown in FIG. 2.

Refer to FIG. 4 to FIG. 10, which show the cross-sectional views of the semiconductor device obtained by performing the subsequent steps based on the cross-sectional view shown in FIG. 2. As shown in FIG. 4, a first etching step E1 is performed to remove the mask layer 137 at a top portion of the bit line BL and form a rounding hard mask 138. It should be noted that the mask layer 137 in FIG. 2 has a rectangle cross-sectional structure, and in FIG. 4, the mask layer is removed by anisotropic etching or the like, and a rounding hard mask 138 is formed. During the process for forming the rounding hard mask 138, the original mask layer 137 is not only partially chamfered, but the rounding hard mask 138 is sufficiently etched, so that the top surface of the completed rounding hard mask 138 is not a flat surface and is round. More precisely, the rounding hard mask 138 has a semi-elliptical or a bullet-shaped cross-sectional profile. In more detail, in the present embodiment, the bottom surface of the rounding hard mask 138 is defined to have a width W1, and the rounding hard mask 138 has a height H. In addition, the width at a height ¼ H from the top surface of the rounding hard mask 138 (in other words, the position from the top surface of the rounding hard mask 138 vertically downwards ¼ H) is defined as W2, and the width at a height ½ H from the top surface of the rounding hard mask 138 (in other words, the position from the top surface of the rounding hard mask 138 vertically downwards ½ H) is defined as W3. In this embodiment, since the rounding hard mask 138 is sufficiently etched and has a semi-elliptical cross-section profile, the conditions of W2/W1<0.5, and W3/W1<0.7 are satisfied.

In addition, as shown in FIG. 4, when the first etching step E1 is performed, a protective layer 139 may be additionally formed to cover the insulating layer 123 and the spacers 127 for protecting the insulating layer 123 and the spacers 127 from being destroyed during the etching step E1. When the rounding hard mask 138 is formed, the protective layer 139 can be removed. It can be understood that, in some embodiments, if the insulating layer 123 and/or the spacers 127 and the rounding hard mask 138 comprise different insulating materials, an etchant having faster etching rate for the rounding hard mask 138 can be used. In this case, the protective layer 139 can be omitted, and this embodiment is also within the scope of the present invention.

In the conventional step, when the bit line is completed, a storage node contact plug is then formed beside the bit line to connect the source to the capacitor structure or the like. However, the height of the storage node contact plug is relatively high. If there has not enough space reserved beside the bit line, during the manufacturing process, the storage node contact plug is less likely to be formed, or the storage node contact plug may have a narrower width. The issue will leads the resistance of the storage node contact plug increased, which is detrimental to the overall yield of the semiconductor device. In the present invention, the mask layer 137 at the top portion of the bit line BL is etched, and a rounding hard mask 138 is then formed. Since the rounding hard mask 138 has a narrower top and wider bottom structure, a larger space will be remained beside the bit line BL. In the subsequent step, it is advantageous to form a storage node contact plug adjacent to the bit line BL, and overall fabrication yield of the semiconductor device can be improved. Besides, the issue of the increased resistance of the storage node contact plug mentioned above can be avoided.

Figure 5:
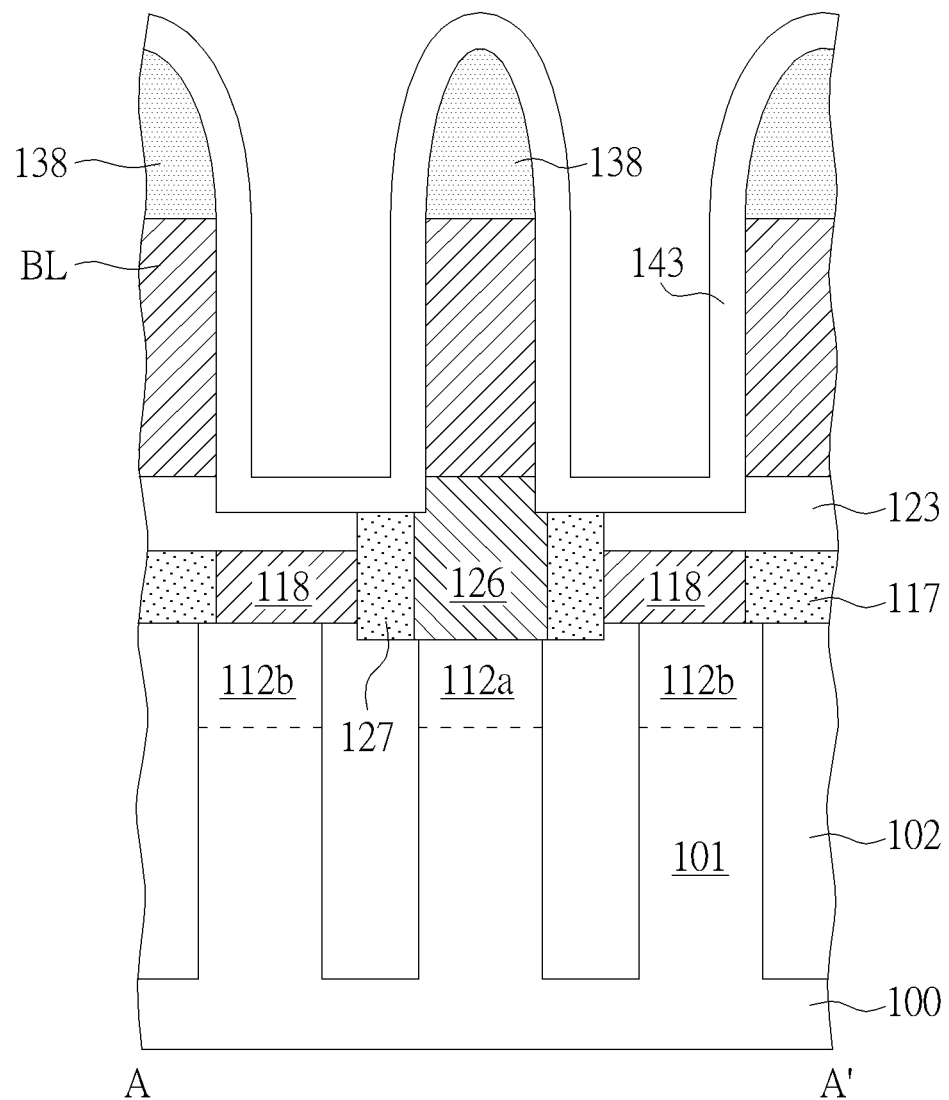

Next, as shown in FIG. 5, a spacer 143 is formed between the bit lines BL. The spacer 143 herein comprises an insulating material, such as silicon oxide, silicon nitride or silicon oxynitride, etc., which can be used to electrically isolate the bit line BL and subsequently form a storage node contact plug (not shown). In addition, the spacer 143 may comprise a single layer or a multi-layer composite structure, both of them are within the scope of the present invention.

Figure 6:
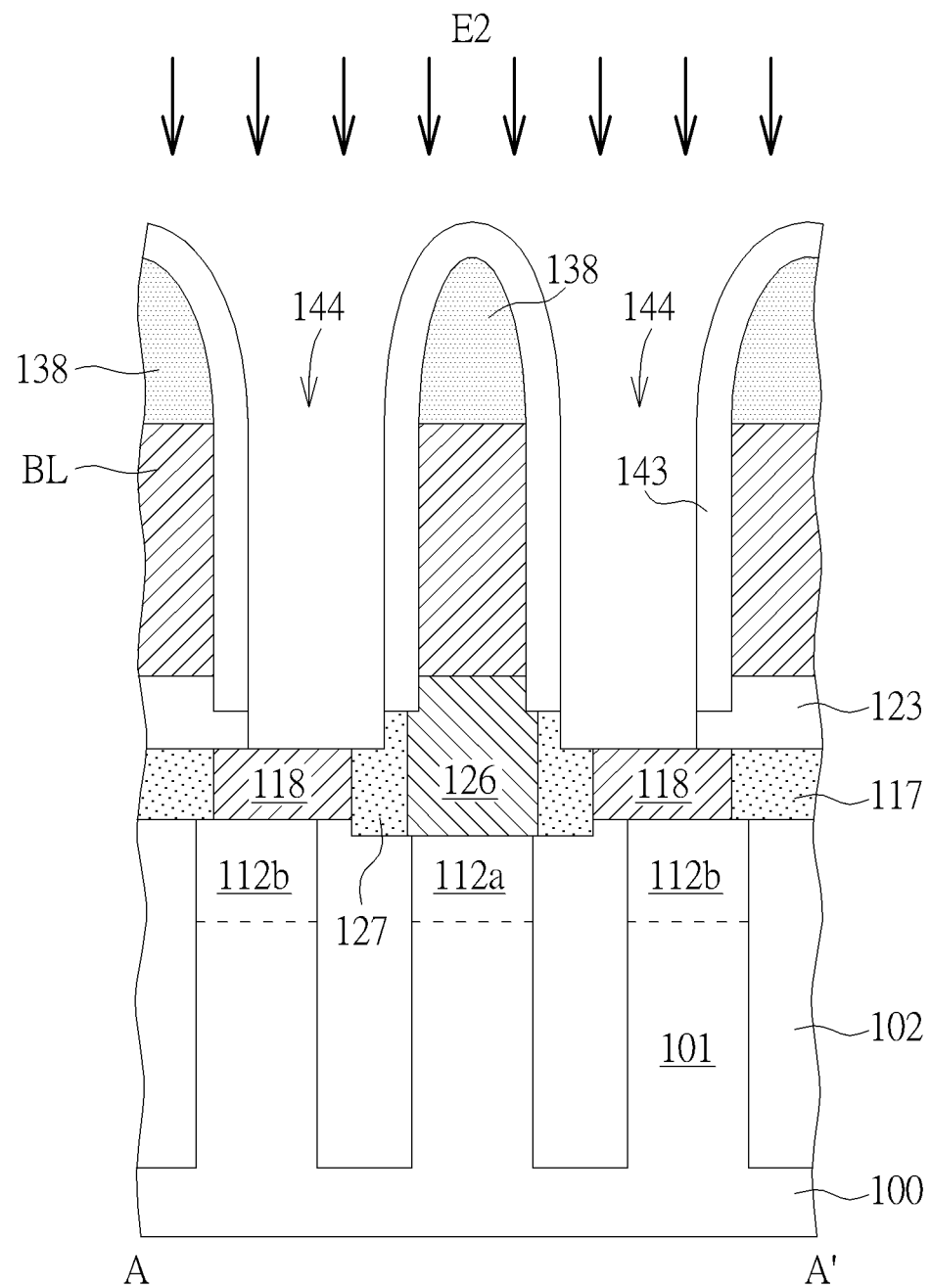

As shown in FIG. 6, a second etching step E2 is performed to remove portions of the spacer 143 and to form at least one recess 144, the recess 144 is the position where the storage node contact plug are intended to be formed in the subsequent steps. The recess 144 exposes the underlying storage node pad 118.

Figure 7:
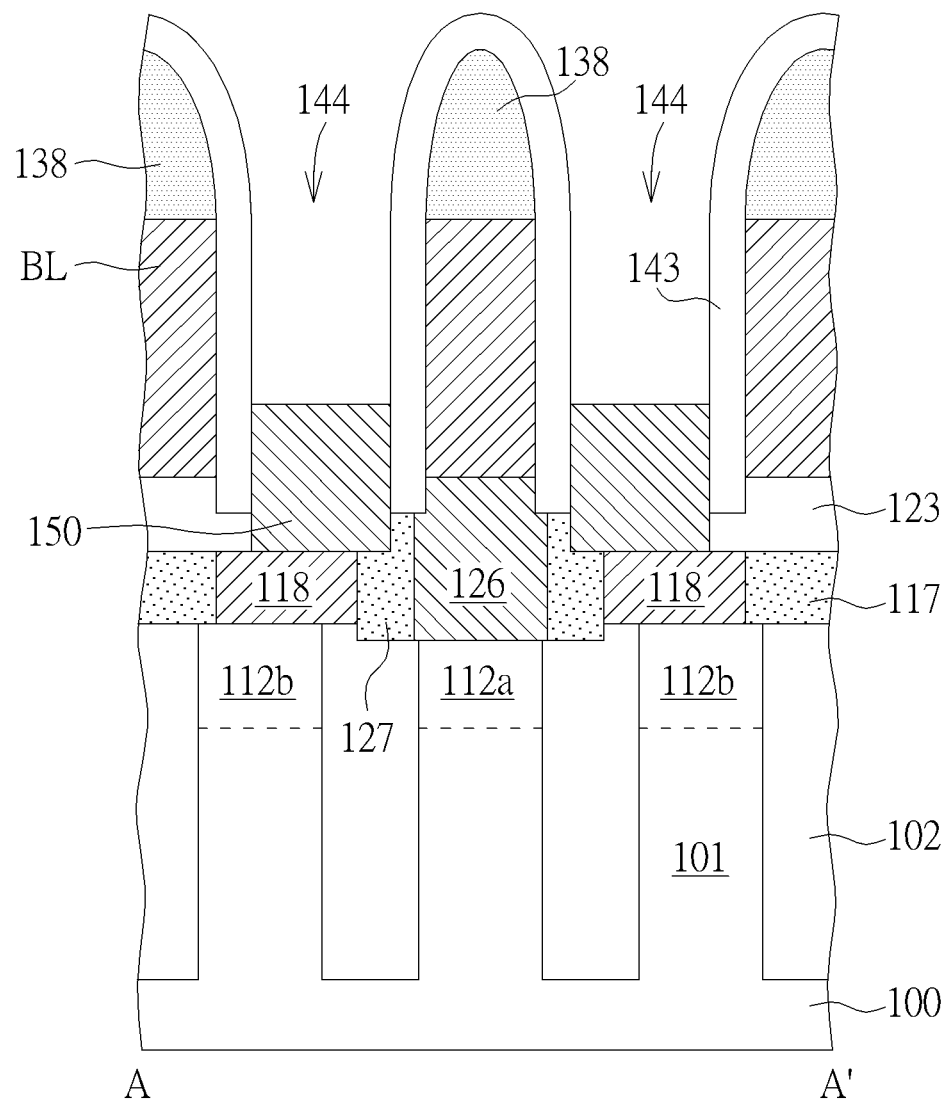
Figure 8:
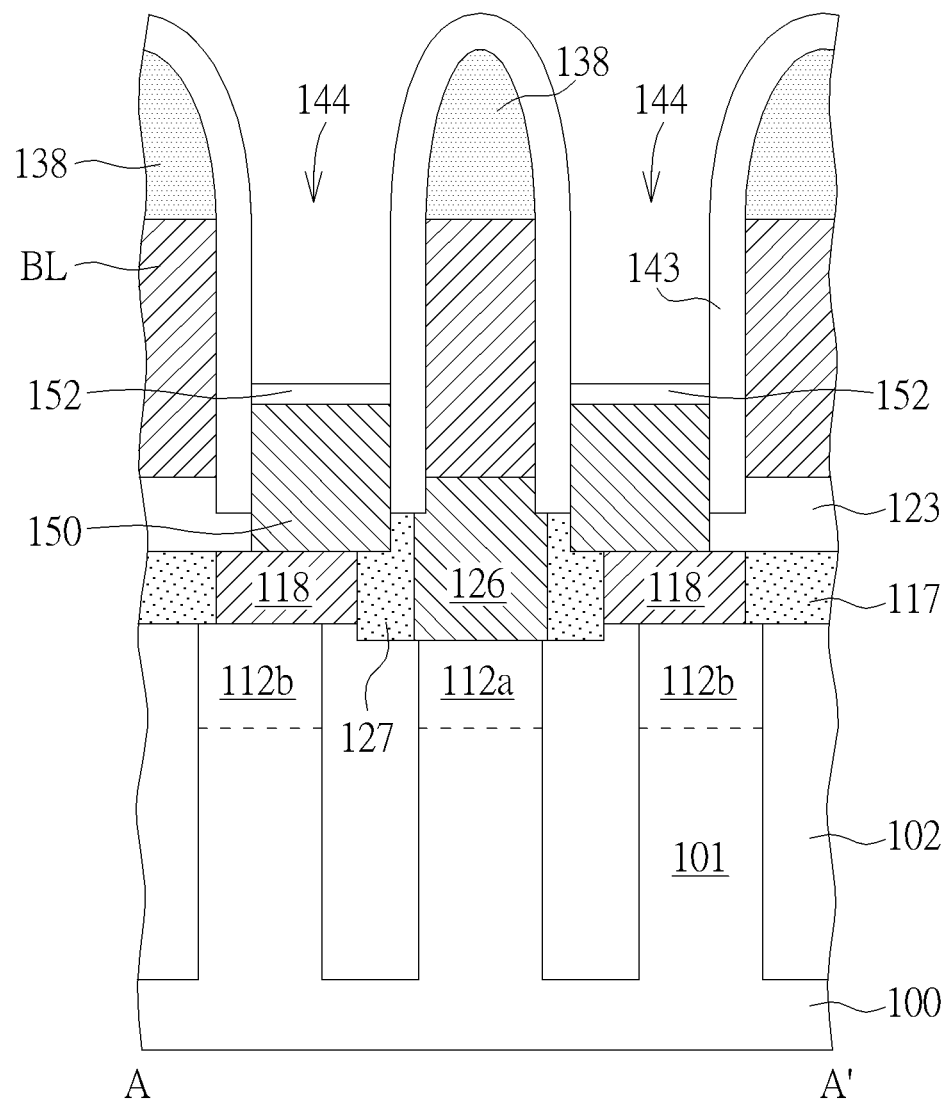
Figure 9:
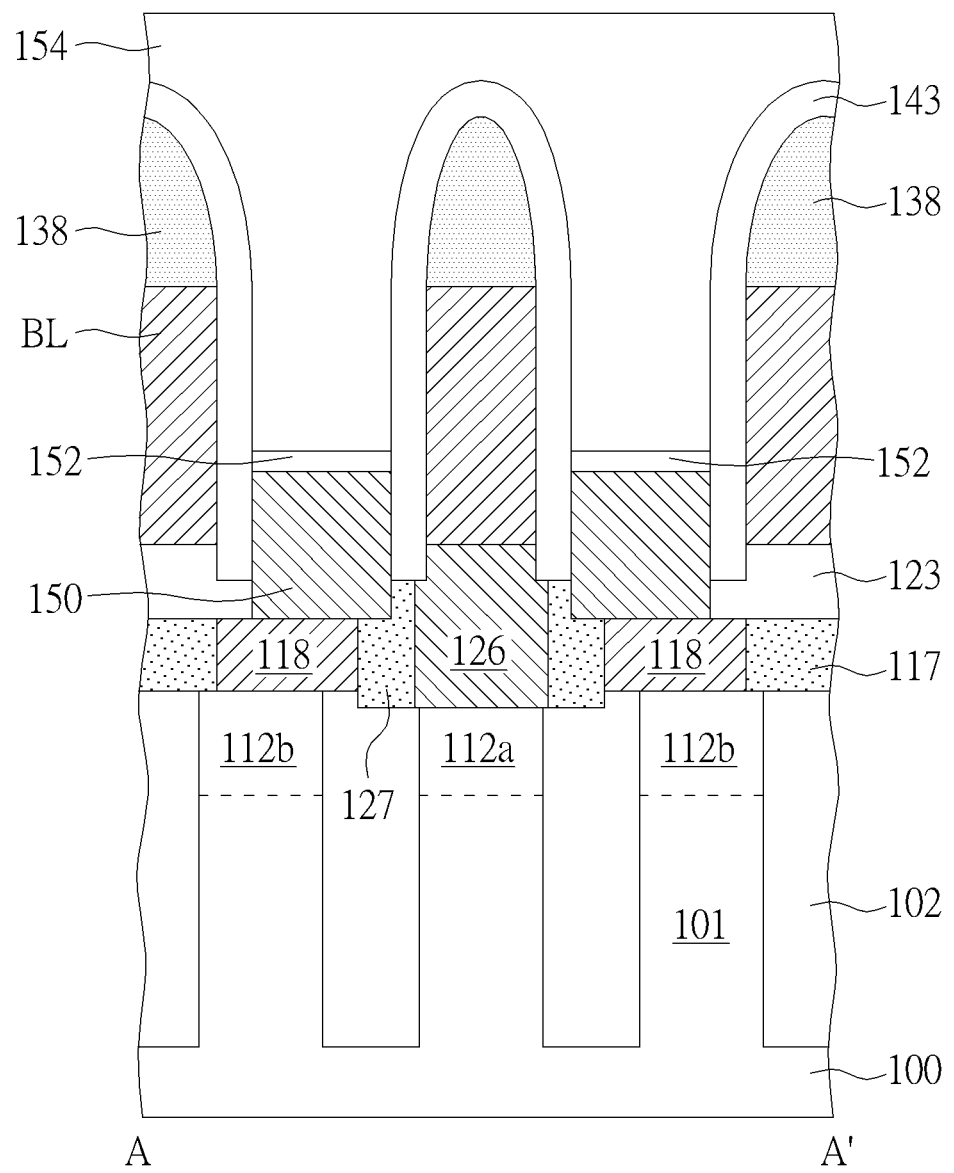

As shown in FIG. 7 to FIG. 9, a polysilicon layer 150, a metal silicide layer 152, and a conductive layer 154 are sequentially formed in the recess 144. The polysilicon layer 150 is doped with ions of the same type as the storage node pads 118 (e.g., n-type ions). The metal silicide layer 152 may be formed of titanium silicide, cobalt silicide, nickel silicide, tungsten silicide, platinum silicide, and/or molybdenum silicide. The conductive layer 154 may include a conductive material such as tungsten, copper, and/or aluminum. All the polysilicon layer 150, the metal silicide layer 152 and the conductive layer 154 belong to part of the storage node contact plug, and they are electrically connected to the underlying doping region 112b (source) though the storage node pad 118, and they are also electrically connected to the subsequently formed data storage component (e.g., capacitor structure, etc.). It should be noted that the conductive layer 154 in FIG. 9 covers the rounding hard mask 138 to electrically connect different storage node contact plugs with each other, so that the conductive layer 154 needs to be partially removed to be electrically isolated different storage node contact plugs.

Figure 10:
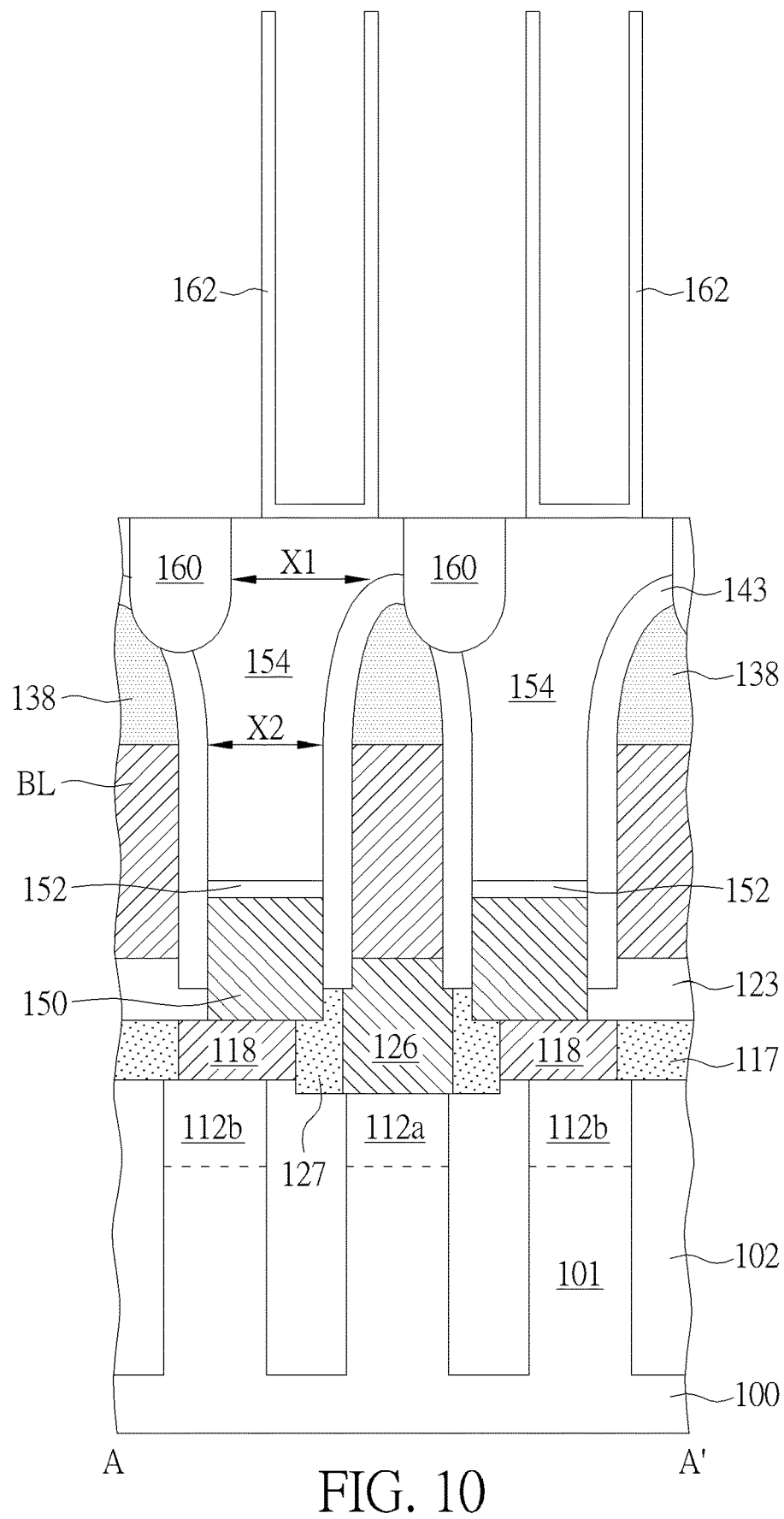

As shown in FIG. 10, a recess is formed in the conductive layer 154, and then a dielectric layer 160 is filled in the recess, the dielectric layer 160 completely covers the conductive layer 154. The dielectric layer 160 is an insulating material, and a portion of the dielectric layer 160 directly contacts the rounding hard mask 138 for electrically isolating different storage mode contact plugs (as shown in FIG. 10, two different storage node contact plugs are electrically isolated with each other by the dielectric layer 160). Next, a data storage component, such as a capacitor lower electrode 162, is formed on the dielectric layer 160, and which is electrically connected to the conductive layer 154 (storage node contact plug). In addition, other contact structures (not shown) may be included between the capacitor lower electrode 162 and the conductive layer 154. The technique belongs to the prior art and will not be further described herein.

It should be noted that in the present invention, since the mask layer 137 is etched to form the rounding hard mask 138, more space is left between adjacent bit lines BL. Especially, the horizontal width near the top surface of the mask layer is increased, therefore, the manufacturing difficulty of the storage node contact plug is reduced. In more detail, the conductive layer 154 in FIG. 10 defines a width X1 and a width X2, the width X1 is aligned in the horizontal direction with the vertex of the rounding hard mask 138, and the width X2 is aligned in the horizontal direction with the bottom W1 of the rounding hard mask 138. In the present embodiment, the condition that X1 is greater than or equal to X2 is satisfied. In this way, the conductive layer 154 of the storage node contact structure does not have an issue of width reduction near the top portion of the rounding hard mask 138.

Figure 11:
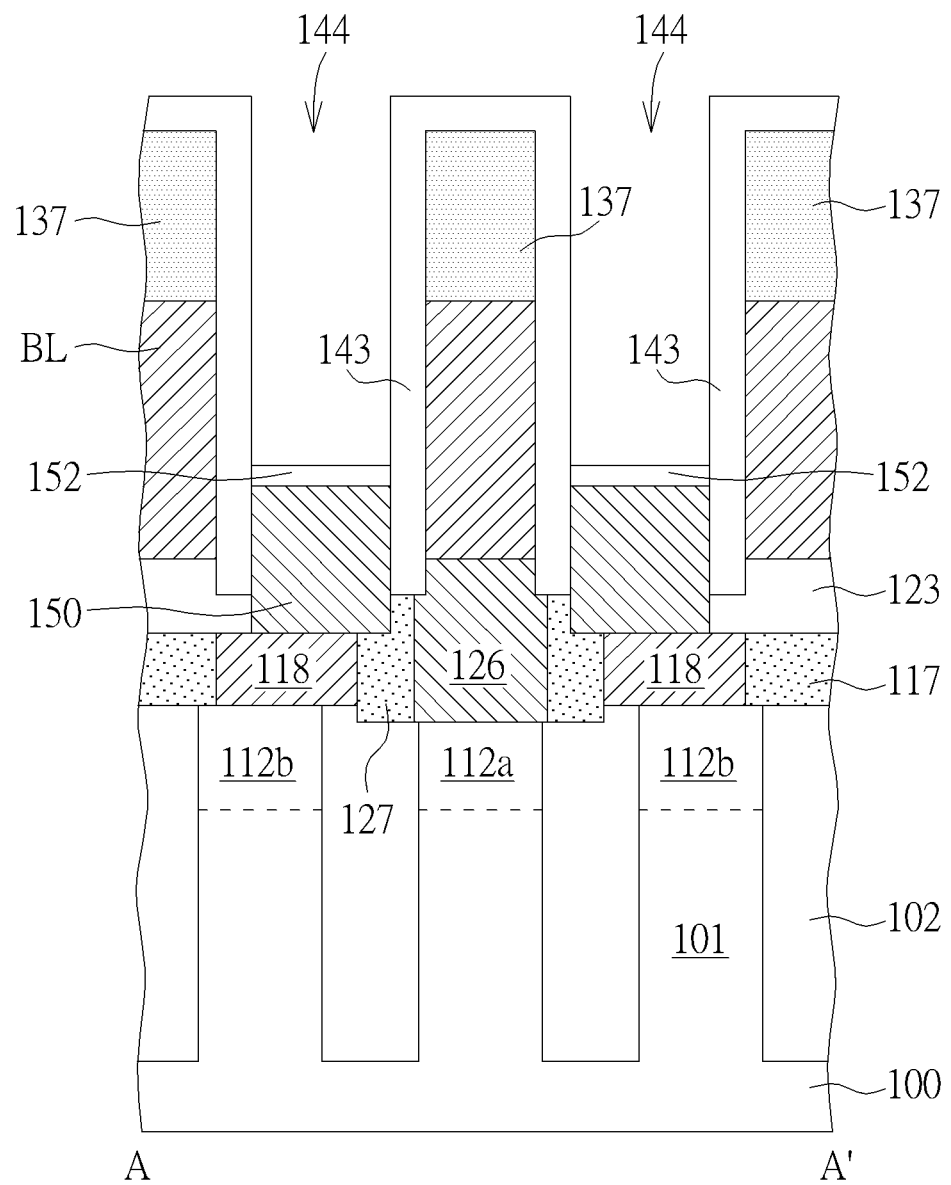
FIG. 11 to FIG. 12 are schematic cross-sectional views showing the fabrication of a semiconductor device in accordance with another embodiment of the present invention.
Figure 12:
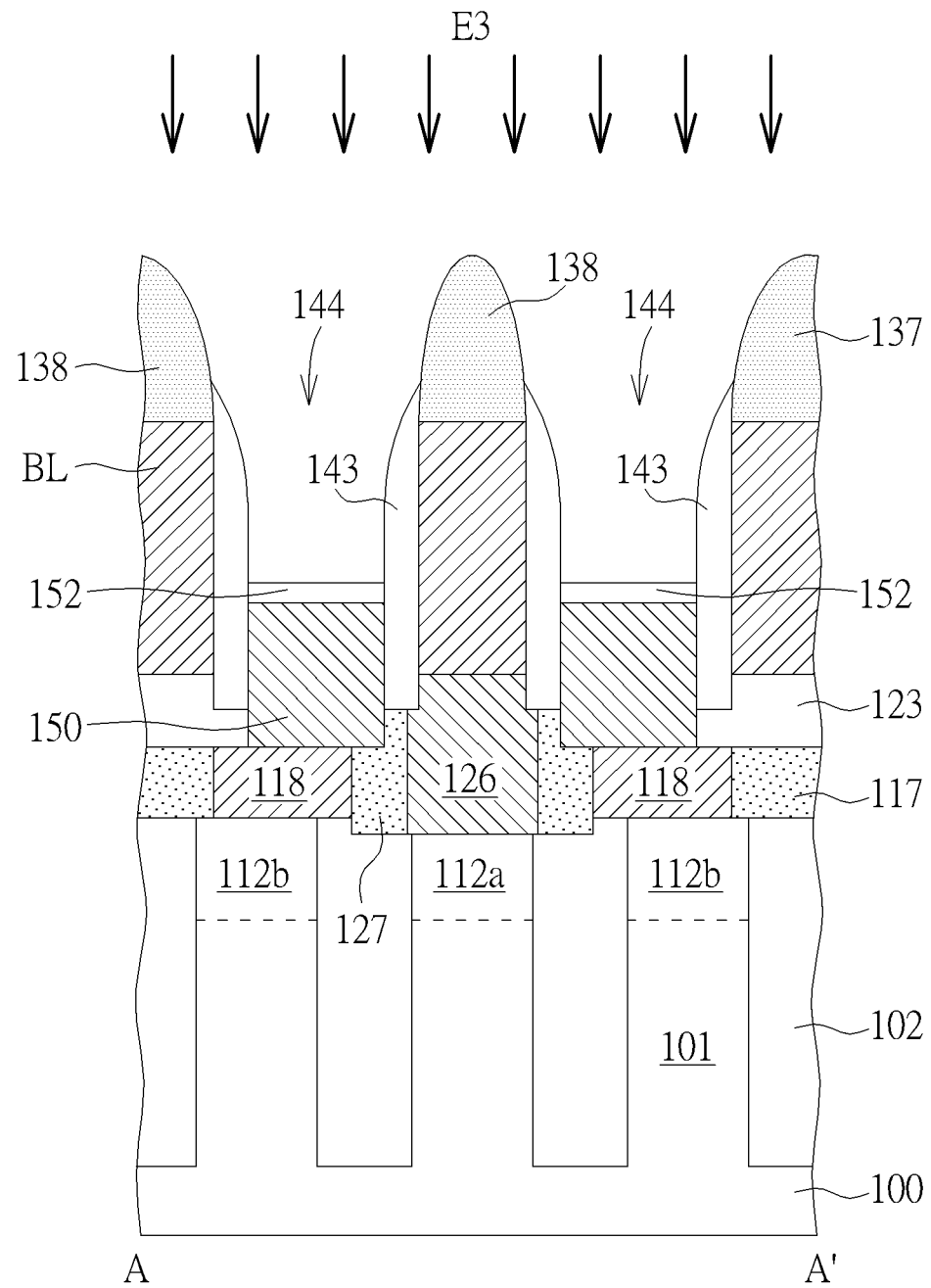

In another embodiment of the present invention, the rounding hard mask 138 may be formed in different step, for example, after forming the polysilicon layer 150 and the metal silicide layer 152 of the storage node contact plugs (as shown in FIG. 8), and the mask layer 137 is then etched to form the rounding hard mask 138. This process is also within the scope of the present invention. More detail, please refer to FIG. 11 to FIG. 12, which are schematic cross-sectional views of fabricating a semiconductor device according to another embodiment of the present invention. As shown in FIG. 11, the semiconductor device is formed in accordance with the steps of the above-described first embodiment, but the first etching step E1 in FIG. 4 is omitted, and the structure as shown in FIG. 11 is therefore formed. Since the mask layer 137 is not etched prior to forming the metal silicide layer 152, the spacer 143 will cover on the mask layer 137 with rectangle cross-sectional structure. Next, as shown in FIG. 12, an etching step E3 is performed, to remove parts of the spacer 143, in particular to remove the spacer 143 that is disposed above the mask layer 137 at the top of the bit line BL, and during this step, parts of the mask layer 137 is also be removed, and the partially removed mask layer 137 is defined as the rounding hard mask 138. It should be noted that in this step, the parameters of the etching step E3 need to be controlled to prevent the etching step E3 from removing the spacer between the storage node contact plug and the bit line BL, thereby causing a short circuit phenomenon. That is, after the etching step E3 is performed, the spacer 143 disposed between the storage node contact plug and the bit line BL is still not removed. The above steps are also within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
 a substrate;
 at least one bit line disposed on the substrate, wherein a rounding hard mask is disposed on the bit line, and the rounding hard mask defines a top portion and a bottom portion;
 at least one storage node contact plug, located adjacent to the bit line, the storage node contact structure plug comprises at least one conductive layer, when viewed from a cross-sectional view, the storage node contact plug defines a width X1 and a width X2, wherein the width X1 is aligned with the top portion of the rounding hard mask in a horizontal direction, and the width X2 is aligned with the bottom portion of the rounding hard mask in the horizontal direction, and wherein the width X1 is greater than or equal to the width X2; and
 at least one dielectric layer covering a portion of the rounding hard mask and directly contacting the rounding hard mask.

2. The semiconductor device of claim 1, wherein the top portion of the rounding hard mask is not a flat surface.

3. The semiconductor device of claim 1, when viewed from the cross-sectional view, the rounding hard mask comprises a top surface and a bottom surface, the height of the rounding hard mask is defined as H, and the width of the bottom surface of the rounding hard mask is defined as W1, the width at a height ¼ H from the top surface of the rounding hard mask is defined as W2, wherein W2/W1<0.5.

4. The semiconductor device of claim 1, when viewed from the cross-sectional view, the rounding hard mask comprises a top surface and a bottom surface, the height of the rounding hard mask is defined as H, and the width of the bottom surface of the rounding hard mask is defined as W1, the width at a height ½ H from the top surface of the rounding hard mask is defined as W3, wherein W3/W1<0.7.

5. The semiconductor device of claim 1, wherein the storage node contact plug further comprises a polysilicon layer disposed under the conductive layer.

6. The semiconductor device of claim 5, further comprising a silicide layer disposed between the conductive layer and the polysilicon layer.

7. The semiconductor device of claim 5, further comprising a storage node pad disposed under the polysilicon layer, wherein the storage node pad is electrically connected to a first diffusion region in the substrate.

8. The semiconductor device of claim 1, further comprising at least one spacer disposed between the storage node contact plug and the bit line.

9. The semiconductor device of claim 1, further comprising a bit line storage node contact structure disposed under the bit line and directly contacting the bit line, wherein the bit line storage node contact structure is electrically connected to a second diffusion region in the substrate.

* * * * *